United States Patent
Anderson et al.

(10) Patent No.: US 9,793,857 B1
(45) Date of Patent: Oct. 17, 2017

(54) METHOD AND APPARATUS FOR CHARACTERIZING LOCAL OSCILLATOR PATH DISPERSION

(71) Applicant: Keysight Technologies, Inc., Minneapolis, MN (US)

(72) Inventors: Keith F. Anderson, Santa Rosa, CA (US); Jan Verspecht, Santa Rosa, CA (US); Troels Studsgaard Nielsen, Aalborg East (DK)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/085,702

(22) Filed: Mar. 30, 2016

(51) Int. Cl.
*H04B 1/26* (2006.01)
*H03D 7/14* (2006.01)
*H04B 1/16* (2006.01)

(52) U.S. Cl.
CPC .......... *H03D 7/1466* (2013.01); *H04B 1/16* (2013.01)

(58) Field of Classification Search
CPC .... H03D 7/125; H03D 7/1441; H03D 7/1408; H03D 9/0633; H03D 7/14; H03D 3/008; H03D 7/165; H03D 3/007; H04B 1/28; H04B 1/30
USPC .......... 455/67.11, 67.13, 131, 313, 323, 326, 455/334
See application file for complete search history.

(56) References Cited

U.S. PATENT DOCUMENTS

| 5,528,632 | A | * | 6/1996 | Lin | ...................... H04L 27/2337 375/324 |
|---|---|---|---|---|---|
| 7,801,505 | B2 | | 9/2010 | VanWiggeren | |
| 8,805,313 | B2 | | 8/2014 | Da Silva | |
| 8,977,211 | B1 | | 3/2015 | Tinella | |
| 9,231,716 | B2 | | 1/2016 | Richmond | |
| 2004/0157551 | A1 | * | 8/2004 | Gainey | .............. H04B 7/15528 455/11.1 |
| 2007/0178845 | A1 | * | 8/2007 | Cutler | .................... H04B 17/16 455/67.11 |
| 2011/0199142 | A1 | * | 8/2011 | Mu | ........................ H03D 7/166 327/299 |
| 2015/0056938 | A1 | | 2/2015 | Vanden Bossche | |

OTHER PUBLICATIONS

Notice of Allowance, U.S. Appl. No. 14/634,638, filed Feb. 27, 2015.
U.S. Appl. No. 14/997,084, filed Jan. 15, 2016.

* cited by examiner

Primary Examiner — Nhan Le

(57) ABSTRACT

A method for calibrating a mixer, an apparatus using the calibrated mixer, and a method for using the apparatus to calibrate another mixer are disclosed. The method includes coupling a first RF signal characterized by a first timezero phase and a first RF frequency to the RF signal input. The method includes (a) coupling a first LO signal characterized by a first LO frequency and a first LO timezero phase to the LO signal input terminal; (b) determining an IF tone timezero phase of a tone from the IF signal output corresponding to the first LO signal; and (c) determining a first after LO signal path timezero phase from the IF tone and first LO timezero phase. Steps (a), (b), and (c) are repeated for second and third LO signals. An LO phase change as a function of frequency introduced by the LO signal path is then determined.

6 Claims, 10 Drawing Sheets

METHOD AND APPARATUS FOR CHARACTERIZING LOCAL OSCILLATOR PATH DISPERSION

BACKGROUND OF THE INVENTION

Many measurement instruments utilize heterodyne receivers. The receivers are used to down-convert an input signal to an intermediate frequency (IF) that can then be analyzed to determine the characteristics of the input signal in some frequency band that is much less than the highest frequency in the input signal. FIG. 1 illustrates a typical heterodyne receiver 10.

A repetitive input signal, typically generated by a device under test (DUT) is down-converted by mixing the signal with the signal from a local oscillator (LO) 11 in a mixer 12 to create an IF signal. The IF signal consists of tones that correspond to some of the tones in the input signal. By characterizing the tones in the IF signal, information about the corresponding tones in the input signal is obtained. The output of mixer 12 is digitized in an analog-to-digital converter (ADC) 13 to create a sequence of digital values that are transformed by a fast Fourier transforms (FFT) or similar transform using digital signal processor (DSP) 14 to provide the amplitude and a set of phases corresponding to the various frequency components in the IF signal. The amplitudes of the tones do not depend on the phase of the LO signal or the time at which the sequence of digital values begins relative to the phase of the IF signal.

The calculated phases, in contrast, are determined by the phases of the components in the input signal, the phase of the LO relative to those phases and the time at which the digital sequence is generated. In many situations, the input signal is characterized by down-converting the input signal with a number of different LO frequencies that are generated by controller 15. Hence, the final result will depend on the differences in phases of the LO signals from frequency to frequency. However, even if the phases of the LO signals are known at the LO signal generator for each of the frequencies, the components between the LO signal generator and the mixer alter the phase. Hence, a method for determining the contributions of these components as a function of frequency is required.

SUMMARY OF THE INVENTION

The present invention includes a method for calibrating a mixer, an apparatus using the calibrated mixer, and a method for using the apparatus to calibrate another mixer. The mixer being calibrated has an LO signal input, an RF signal input, and an IF signal output. The LO input is characterized by an LO signal path coupling an LO signal input terminal to the mixer LO signal input. The method includes coupling a first RF signal characterized by a first timezero phase and a first RF frequency to the RF signal input. The method also includes (a) coupling a first LO signal characterized by a first LO frequency and a first LO timezero phase to the LO signal input terminal;

(b) determining an IF tone timezero phase of a tone from the IF signal output corresponding to the first LO signal; and (c) determining a first after LO signal path timezero phase from the IF tone and first LO timezero phase. Steps (a), (b), and (c) for second and third LO signals are characterized by different LO frequencies from the first LO signal and each other. An LO phase change as a function of frequency introduced by the LO signal path is determined from the timezero phases.

In one aspect of the invention, determining the LO phase change as a function of frequency includes fitting the first, second, and third LO signal path timezero phases to a straight line and determining the deviation of each of the after LO signal path timezero phases from the straight line.

In a further aspect of the invention, the method includes coupling a second RF signal characterized by a second timezero phase and a second RF frequency to the RF signal input. The method further includes (d) coupling a fourth LO signal characterized by a fourth LO frequency and a fourth LO timezero phase to the LO signal input terminal;

(e) determining an IF tone timezero phase of a tone from the IF signal output corresponding to the fourth LO signal; and (f) determining a fourth after LO signal path timezero phase from the IF tone and fourth LO timezero phase.

Steps (d), (e), and (f) are repeated for fifth and sixth LO signals characterized by different LO frequencies from the fourth LO signal and each other; and an LO phase change as a function of frequency introduced by the LO signal path is determined.

An apparatus according to the present invention includes a mixer assembly having a mixer and an LO signal generator. The mixer is characterized by an RF input, an LO input, and an IF output. The LO input is characterized by an LO signal path coupling an LO signal input terminal to the mixer LO input, the LO signal path introducing phase distortions into an LO signal connected to the terminal. The LO signal generator generates an LO signal having a known timezero phase and couples the LO signal to the terminal. The apparatus also includes a receiver having an IF input connected to the IF signal output, the receiver being adapted to receive an IF signal on the IF input and a controller that corrects the known LO timezero phase for the phase distortions and determines a phase of a tone in the RF signal from the corrected timezero phase and a tone in the IF signal.

In another aspect of the invention, the receiver is a timestamped receiver.

In yet another aspect of the invention, the mixer assembly is a calibrated mixer assembly. In one aspect, the mixer assembly is adapted to receive a first test signal having one or more tones. The receiver records a first sequence of digital values starting at a first time and a timestamp value at the first time. The mixer assembly generates a first LO signal and couples that LO signal to the LO input, the controller generating a first phase spectrum from the sequence of the digital values starting at the first time and the timestamp value at the first time, the first phase spectrum includes a phase corresponding to each of the tones in the first test signal, the first phase spectrum is independent of the first time. The mixer assembly then generates a second LO signal and couples that LO signal to the LO input. The controller generates a second phase spectrum from a second sequence of digital values starting at a second time and a second timestamp value at the second time, the second LO signal having a different frequency from the first LO signal and the controller combining the first and second phase spectra.

The present invention also includes a method for determining phase distortions in a target mixer having an RF input, an LO signal input, and an IF signal output. The method includes coupling a first LO mixer signal to the LO signal input to the target mixer. For each of a plurality of RF frequencies, $RF_i$ (a) generating a single tone RF signal having frequency $RF_i$ (b) measuring an input timezero phase for the single tone RF signal in a VNA having a calibrated mixer assembly and a timestamped receiver;

(c) coupling the single tone RF signal to the RF input of the target mixer;

(d) measuring an output timezero phase of a tone leaving the IF signal output of the target mixer in the VNA; and (e) determining a difference phase between the input timezero phase and the output timezero phase.

The difference phases as a function of the RF frequency are fitted to a line; and deviations from the line of the difference phases as a function of frequency are determined. In one aspect, the input timezero phases are measured at times different from the output timezero phases.

DETAILED DESCRIPTION OF THE PREFERRED EMBODIMENTS OF THE INVENTION

The manner in which the present invention provides its advantages depends on the ability to determine the phase of a sinusoidal signal source when the signal source changes frequency from an initial frequency of $\omega_1$ to a second frequency $\omega_2$. Denote the first signal by $$V_1(t) = A_1 \cos(\omega_1 t + \theta_1) \quad (1)$$

The phase that is measured when the signal is measured is the instantaneous phase given by $$\Phi_1(t) = \omega_1 t + \theta_1 \quad (2)$$

This phase depends on the time at which the signal is measured. In general, the difference in phase between two signals is the quantity of interest. Denote the second signal by $$V_2(t) = A_2 \cos(\omega_2 t + \theta_2) \quad (3)$$

The phase difference is $\Phi_2 - \Phi_1 = (\omega_2 - \omega_1)t + (\theta_2 - \theta_1)$. This quantity is only time invariant if the frequencies of the two signals are the same. Hence, defining a phase difference that is independent of the time at which the signals are measured presents challenges if the frequencies of the two signals are different from one another.

Implicit in the above equations is the assumption that there is a clock that measures the time, t, shown in these equations. In the following discussion, the timezero phase of a sinusoidal signal is defined to be the phase of the signal at time=0 on this clock, that is, $\theta_1$ in Eq. (2). While the instantaneous phase difference between $V_1(t)$ and $V_2(t)$ is a function of t, the timezero phase difference $(\theta_2 - \theta_1)$ is invariant even in the case in which the two signals have different frequencies. Furthermore, even in the case in which the second signal is measured with respect to a different time scale that is offset relative to the time scale used to define the first signal, i.e., a different clock, the timezero phase of the difference signal is still invariant. In this case, the timezero phase of the difference signal is $\Phi_2(t_0) - \Phi_1(0) - \omega_2 t_0$, where $t_0$ is the offset of the two time scales. Hence, if the time, $t_0$, is known, the timezero phase difference can be computed and used in measurements made using the two signals in question. In co-pending U.S. patent application Ser. No. 15/011,306, a mechanism for keeping track of the time at which the frequencies of a signal generator are changed so that the difference in time of the timezero phases can be obtained is described.

Figure 1:
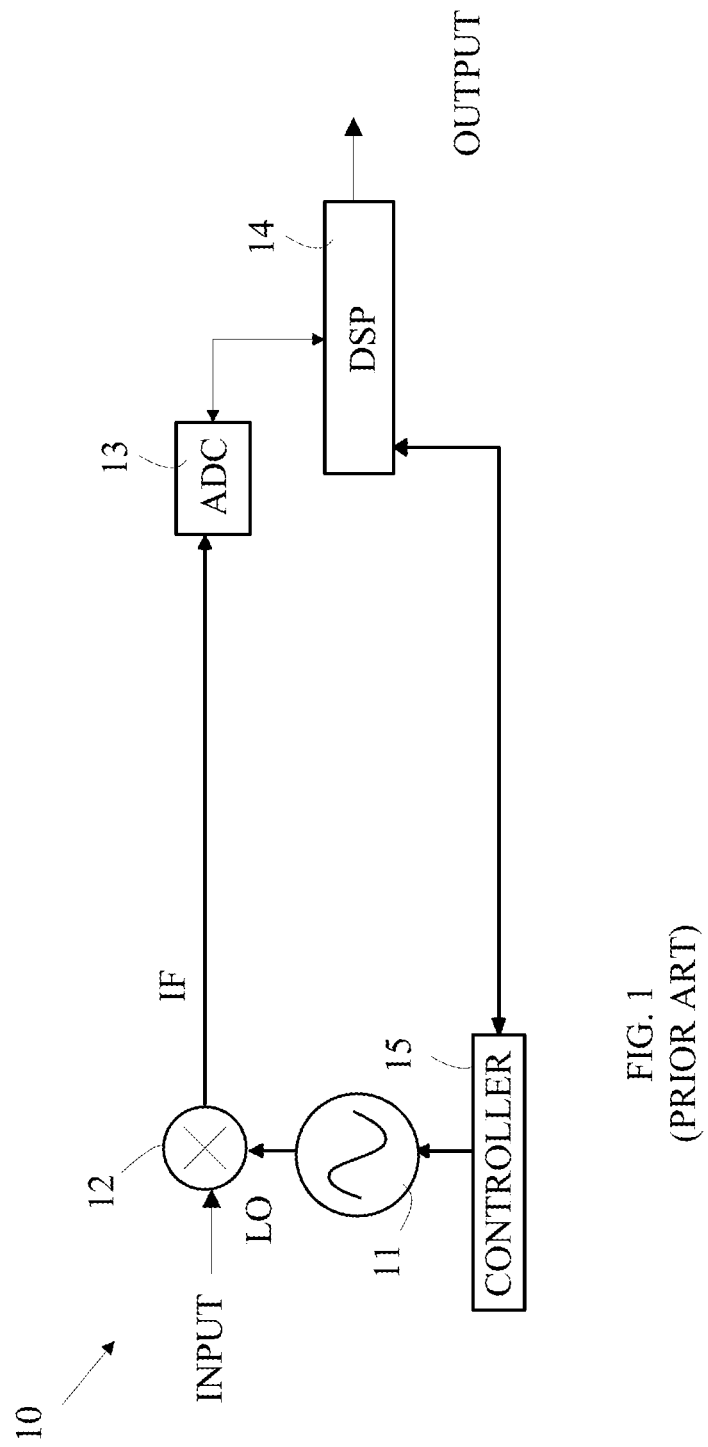
FIG. 1 illustrates a typical heterodyne receiver.
Figure 2:
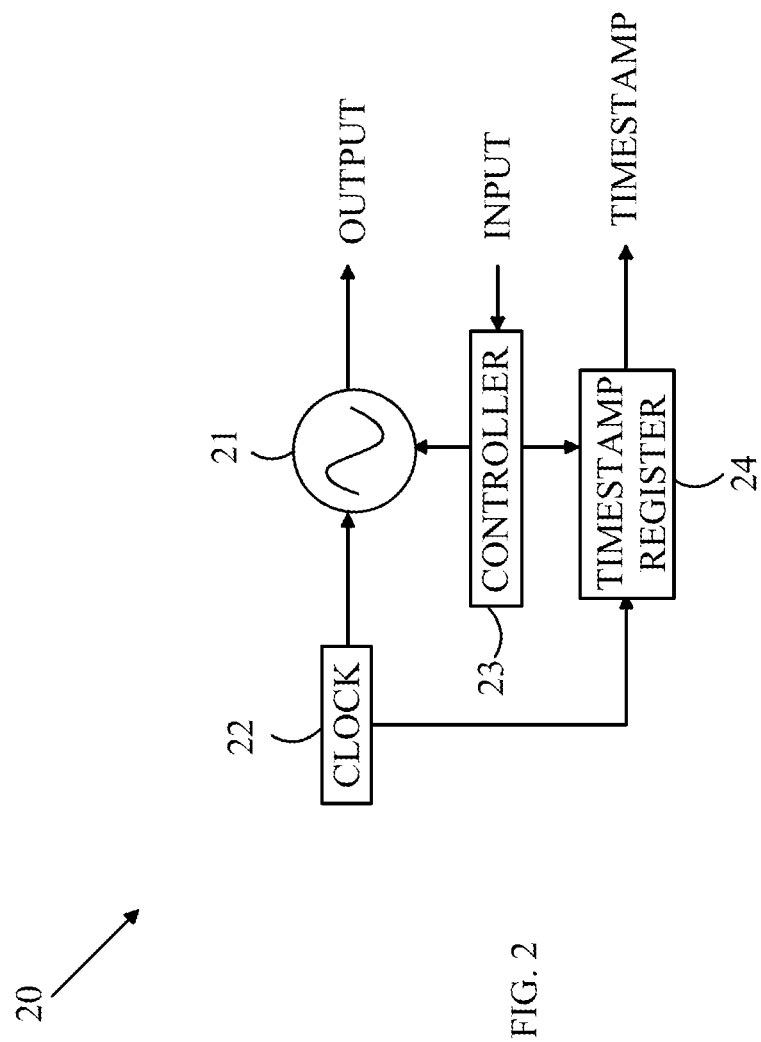
FIG. 2 illustrates one embodiment of a signal generator that allows the phase of a signal to be tracked across a frequency change.

Refer now to FIG. 2, which illustrates one embodiment of a signal generator that allows the phase of a signal to be tracked across a frequency change. In signal generator 20, a variable frequency sine wave generator 21 has an output that is controlled by a reference oscillator, which in this embodiment is reference clock 22. A register, referred to hereinafter as a timestamp register, counts the clock pulses. The timestamp register is reset prior to any use of any signals from signal generator 20 and has sufficient bits that it will not overflow during the time in which signal generator 20 is in operation. Hence, timestamp register 24 stores an absolute time index that characterizes signal generator 20. A controller 23 sets the frequencies of sine wave generator 21 in response to input commands that specify the desired output frequency. When controller 23 receives a command to change the frequency of the output, controller 23 provides the relevant changes to sine wave generator 21 and reads out timestamp register 24 to generate a timestamp.

Figure 3:
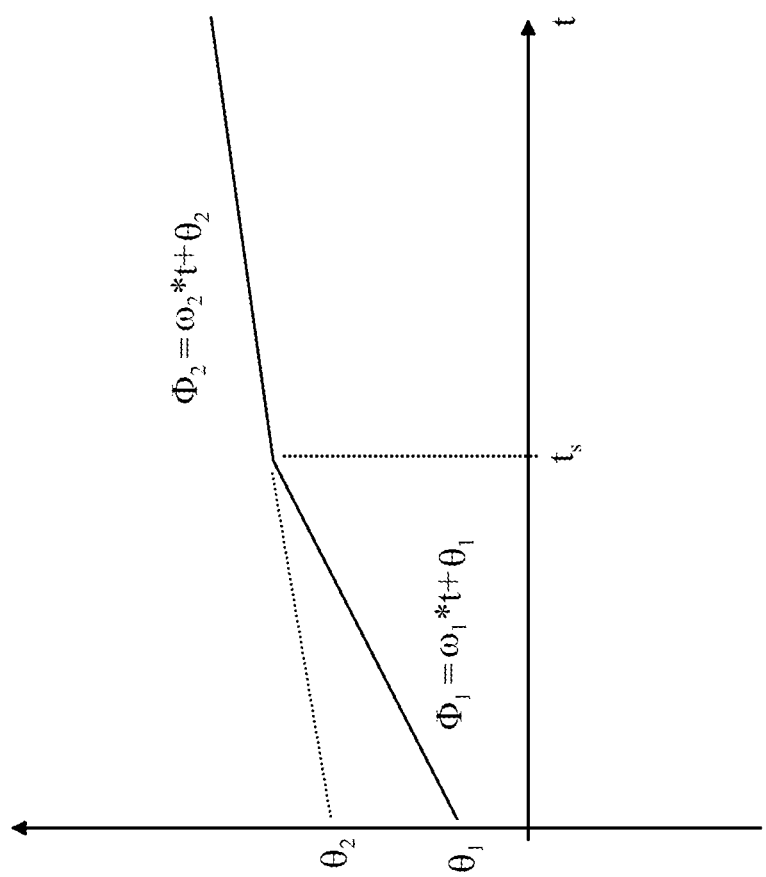
FIG. 3 illustrates the phase of the signal from signal generator 20 when the frequency is switched from $\omega_1$ to $\omega_2$ at a time, timestamp.

Refer now to FIG. 3, which illustrates the phase of the signal from signal generator 20 when the frequency is switched from $\omega_1$ to $\omega_2$ at a time, timestamp. During the first period, the signal has a frequency $\omega_1$, and the phase evolves over time according to $\Phi_1(t) = \omega_1 t + \theta_1$. In the second period, the phase evolves over time according to $\Phi_2(t) = \omega_2 t + \theta_2$. At $t_s$, $\Phi_2(t_s) = \Phi_1(t_s)$; hence, $\theta_2 = \theta_1 + (\omega_1 - \omega_2)t_s$. Hence, knowing the timestamp allows the user of signal generator 20 to know the timezero phase of the signal after the frequency change. The timezero phase, in turn, allows the phase of the second signal to be determined at any time after the timestamp in terms of the timezero phase of the first signal. In the above example, the phase of the signal after the frequency change is known relative to the phase of the signal prior to the frequency change. Hence, if the phase prior to the frequency change is known at one point in time, the phase of the signal at any future point after that point in time can be computed. Hence, if sine wave generator 21 can be reset to a known phase and the time at which the reset took place is recorded in a timestamp, the absolute phase to the output of signal generator 20 is known even across frequency changes.

Figure 4:
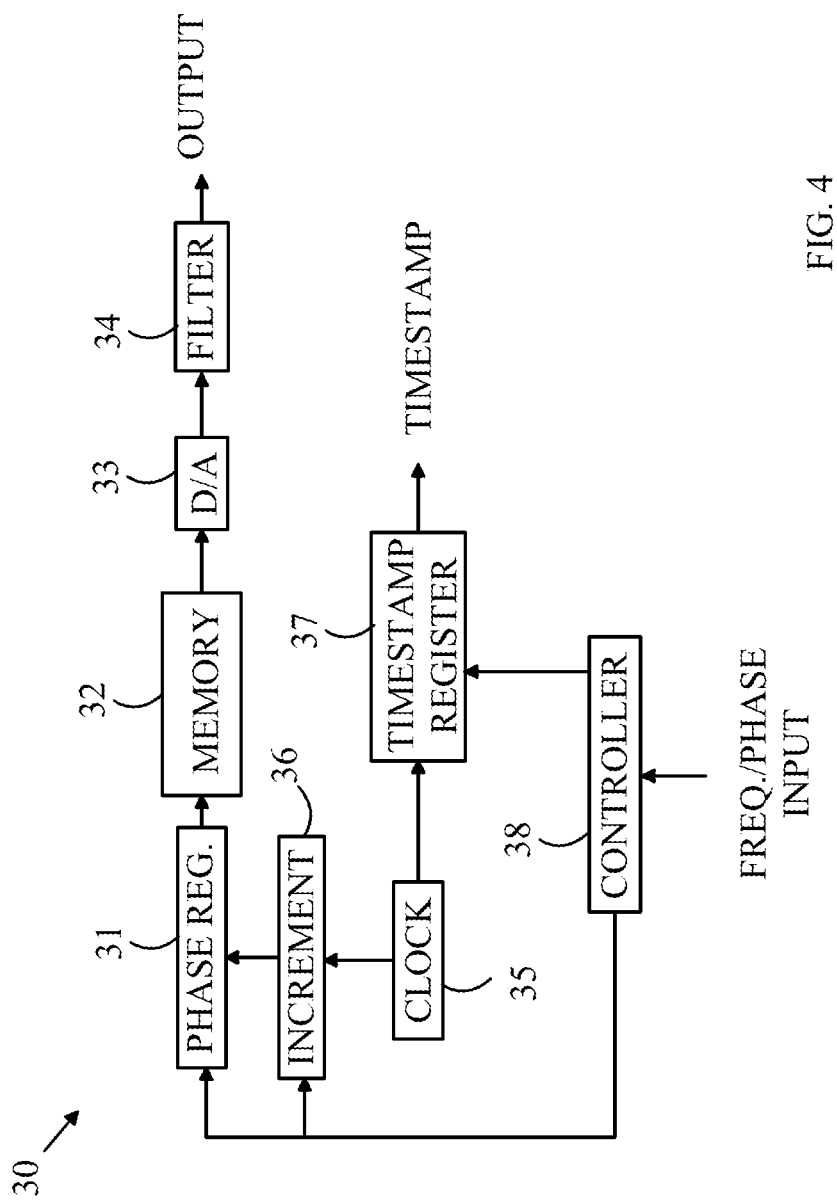
FIG. 4 illustrates an embodiment of the present invention in which the sine wave generator is a direct digital synthesizer (DDS).

Refer now to FIG. 4, which illustrates an embodiment of the present invention in which the sine wave generator is a DDS. A DDS stores a digital representation of a sine wave in memory 32. The representation is essentially a table of amplitude values as a function of the phase of the sine wave. At any given time, the phase of the output signal is specified in phase register 31 which is a pointer into the table. The register is incremented by each cycle of clock 35. The output of memory 32 is then converted to an analog value by digital-to-analog converter (D/A) 33. The output of D/A 33 is filtered by filter 34 to remove the noise introduced by the digital stepping of the amplitude values. The frequency of the output sine wave is determined by the clock 35 and a value stored in an increment register 36. On each clock cycle, phase register 31 is incremented by the amount stored in increment register 36. The higher the value in increment register 36, the higher the frequency of the output. For example, assume memory 32 stores 360 sine wave values corresponding to phases 0 to 359 degrees. If increment register 36 stores a 1, then one cycle of the sine wave will take 360 clock cycles. If, on the other hand, increment register 36 stores a 2, one cycle will require only 180 clock cycles, and the output frequency will be twice as fast.

Signal generator 30 also includes a timestamp register 37 that counts the pulses from clock 35. Timestamp register 37 is reset once when signal generator 30 is started and not reset again during the period in which signal generator 30 is being used. The size of timestamp register 37 is sufficient to ensure that the count in timestamp register 37 will not overflow. When controller 38 receives a command to change the output frequency, controller 38 changes increment register 36 and records the contents of timestamp register 37. Since the change only involves changing the increment in increment register 36, the phase of the output does not change at the switch point. Hence, the arrangement shown in FIG. 3 satisfies the conditions discussed above.

It should be noted that signal generator 30 could also change the phase of the output at any time by incrementing or decrementing the contents of the phase register directly using controller 38. Hence, if, for example, the timezero phase of the signal at the new frequency was to match the timezero phase of the prior signal, controller 38 would also decrement the phase register by an amount corresponding to $(\omega_1 - \omega_2)t_s$. In addition, resetting phase register 31 to a known value and recording the time at which the reset took place in a timestamp allows the absolute phase of the output signal to be known from that point in time forward.

In one aspect of the present invention a signal synthesizer having a timestamp capability together with a receiving section that also has a timestamp capability is used to measure the linearity of the LO path in a heterodyned receiver. Consider a mixer that forms the difference between a single tone input signal and the LO signal. If the mixer is an "ideal mixer" and there are no components that introduce frequency dependent changes in the LO signal timezero phase as a function of frequency, as noted above, the timezero phase of the difference signal is $\omega_2(t_0) - \Phi_1(0) - \omega_2 t_0$. Here, $\Phi_2(t_0)$ is the timezero phase of the input signal using the LO clock as the time standard, and $t_0$ is the time offset of the input clock relative to the LO clock; $\Phi_1(0)$ is the timezero phase of the LO signal, and $\omega_2$ is the LO frequency. In general, the time offset of the two clocks is not known. In addition, any constant delay between the signal source and the LO is equivalent to another time offset between the two clocks. Hence, a measurement of the timezero phase of the difference signal in the receiver will be a linear function of the LO frequency. The slope of this line depends on the effective offset in the two clocks. If the offset remains constant while the frequency of the LO signal is changed, the resulting timezero phase of the difference signal as a function of the LO frequency will be a line characterized by a slope and offset. A timestamped signal source used for the mixer allows the timezero phase of the output of the signal source to be known at each of the frequencies, provided there are no intervening components in the path from the LO signal generator to the mixer that introduce frequency dependent phase shifts into the LO signal. If such components are present, the timezero phase of the difference signal will no longer be a linear function of the mixer frequency.

This aspect of the present invention is based on the observation that by measuring the difference frequency as a function of the LO frequency and determining the difference between the measured difference timezero phase and a line, the amount of any frequency dependent phase distortions in the LO signal path can be determined.

To make the required measurements, the timezero phase of the difference signal must be measured for each of a number of LO frequencies. These values must be measured at different times in the receiver. Hence, the system must deal with another clock offset to allow the receiver to compute the timezero phases of each of the difference signals with respect to the time at which the difference signals are measured. The manner in which this final translation is performed will be discussed in more detail below.

In the following discussion, a timestamped receiver is defined to be a receiver having a first signal port adapted to receive a test signal having one or more tones, an ADC that generates one digital value from the first test signal in response to each clock pulse from an ADC clock. The timestamped receiver also includes a phase clock register that includes a timestamp value that is incremented on each clock pulse from the ADC clock and a processor that records a sequence of digital values starting at a first time and the timestamp value at said first time. The processor generates a phase spectrum from the sequence of digital values using a Fourier transform. The timestamp value from the timestamp register that is in the receiver is used to correct the timezero phases generated by the receiver for the different times at which the difference signals are analyzed.

Figure 5:
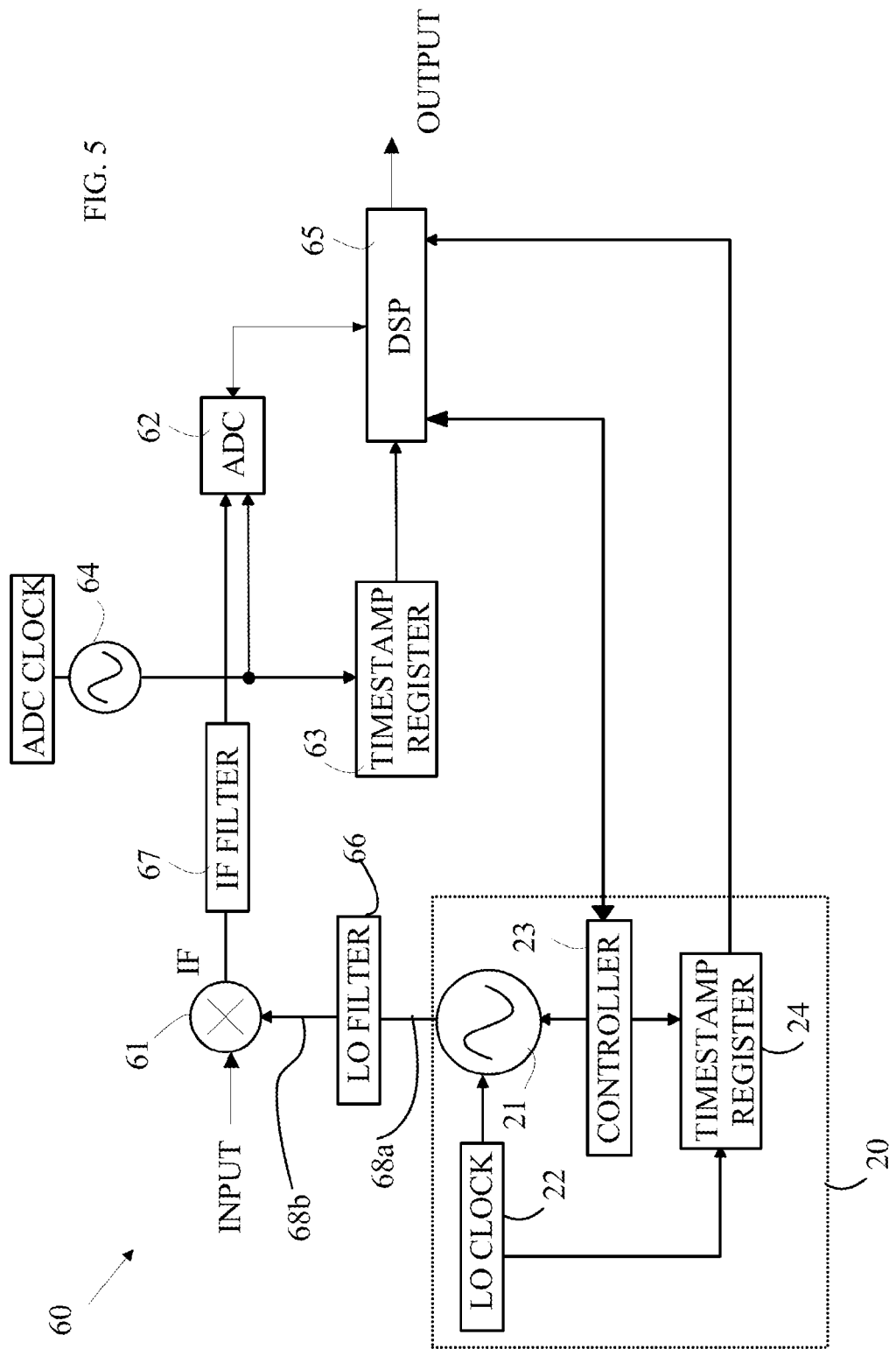
FIG. 5 illustrates a heterodyned receiver 60 that utilizes a coherent signal source according to one embodiment of the present invention and a timestamped receiver.

Refer now to FIG. 5, which illustrates a heterodyne receiver 60 that utilizes a coherent signal source according to one embodiment of the present invention and a timestamped receiver. A repetitive input signal is input to a mixer 61. The output of mixer 61 is an IF signal that has been down-converted to a new frequency range. A filter 67 removes the unwanted components of the mixed signal. It will also be assumed that the mixer utilizes low-side LO mixing, i.e., IF=RF−LO. For the purposes of the present discussion, it is sufficient to note that the IF signal has one or more tones. Each tone in the IF signal is characterized by a frequency and a phase that changes over time. In many measurements of interest, the amplitude and phases of the tones in the input signal are to be determined from the amplitudes and phases of the components of the IF signal. Typically, this is accomplished by digitizing the IF signal using an ADC such as ADC 62 and processing the digital time domain signal in a DSP 65, which performs an FFT on the sequence to arrive at a set of amplitudes and phases for the components in the IF signal.

While the amplitudes for the IF frequency components are independent of the phase of the LO and the time at which the ADC sampling begins, the phases measured by DSP 65 depend on both of these factors. The phase of the IF signal that is being digitized depends on the difference between the phase of the input RF signal to the mixer and the phase of the LO signal. The IF signal is digitized starting at some time. When this sequence is transformed by the FFT, each sample in the sequence is multiplied by a corresponding sample representing the basis functions of the transform executed by the FFT. Consider the transformation of the samples to determine the amplitude and phase of a tone at frequency $\omega$. The transform computes the integral of the signal times $\cos(\omega t)$ and the signal times $\sin(\omega t)$. Hence, the transform assumes that the signal values correspond to known time values; that is, the first sample corresponds to $t=0$ on the time axis used by the integration. If the same sequence of values is shifted in time, the integration is equivalent to using basis functions $\cos(\omega t+\theta)$ and $\sin(\omega t+\theta)$ where $\theta$ is determined by the difference in time between the first sequence and the second sequence. The timestamp provided in the timestamped receiver allows the receiver to provide a consistent answer for the phases of the tones when two signals are measured at different times.

Consider a tone in the input signal. That tone is characterized by a phase. That tone is down-converted to a corresponding tone in the IF signal by mixer 61. The corresponding tone of the IF signal has a phase that is offset from the phase in the input signal for that tone by an amount that depends on the phase of the LO signal relative to the phase of the tone in the input signal. If the phase of the LO is known, then the phase of the tone in the IF signal relative to the phase of that tone in the input signal can be determined to within a phase slope term. The timestamp generated from timestamp register 24 allows DSP 65 to determine the phase of the LO signal relative to the timezero phase of the output of sine wave generator 21.

The phase of each tone in the IF signal changes over time. The IF signal can be represented by a signal S(t) of the form $$S(t) = A_0 + \Sigma A_k \cos(k\omega t + \theta_k) \quad (4)$$

where $A_k$ is the amplitude of the $k^{th}$ tone, $\theta_k$ is the phase of the $k^{th}$ tone and $k\omega$ is the frequency of that tone. Consider the measurement of S in a system in which the time coordinates are offset by an amount $t_0$ relative to the system in Eq. (1). Denote time in the new system by $t'$. Here, $t'=t-t_0$.

$$S(t') = A_0 + \Sigma A_k \cos(k\omega(t'+t_0)+\theta_k) = A_0 + \Sigma A_k \cos(k\omega(t')+\Phi_k) \quad (5)$$

where $$\Phi_k = k\omega t_0 + \theta_k \quad (6)$$

Here, $\Phi_k$ is the phase that would be measured in the new time system. From the equation above, it is clear that the amplitudes of the tones do not depend on the choice of the $t=0$ point in time, but the phases do. Consider the case in which all $\theta_k$ are 0. That is, in the original time coordinate system, $\theta$ as a function of k is 0. In the new coordinate system, the phases, $\Phi_k$ now are a linear function of k. DSP 65 measures the IF signal in a time coordinate system that offsets from that time coordinate system of the LO or the input signal. Hence, to compute the phases of the IF signal from the phases measured by DSP 65, a knowledge of the time offset between the two systems is needed, i.e., the value of $t_0$. This time offset is determined by the time at which the digital sequence that is analyzed by DSP 65 is begun. If only one LO frequency is used and only one digital signal is converted, the uncertainty in $t_0$ leads to an unknown phase for each signal; however, the phase difference of the components at $t_0$ can be determined. If, on the other hand, two sets of measurements are to be made at different LO frequencies and times, the phases in the second set of measurements will have a different phase slope and offset than the phases measured in the first set of measurements. As a result, combining the two sets of measurements presents significant challenges.

Since the $t=0$ point on the time scale is arbitrary, assume that the first set of measurements is performed at $t=0$. The second set of measurements is begun at $t=t_0$. When DSP 65 commences recording a sequence of measurements from ADC 62, DSP 65 records a timestamp from timestamp register 63. ADC 62 digitizes the IF signal in response to an ADC clock 64. The pulses from ADC clock 64 are also counted in timestamp register 63. Timestamp register 63 is analogous to timestamp register 24 in that it is reset once at some time prior to the measurements being made and not reset thereafter. The size of timestamp register 63 is sufficient to ensure that the count stored therein will not overflow during the course of the measurements. Hence, DSP 65 "knows" the timestamp values at $t=0$ and $t=t_0$. From these measurements, the phase slope of the second set of measurements relative to the first set of measurements can be determined. The phase offset of the second set of measurements relative to the first set of measurements can then be determined from the timestamp generated from timestamp register 24 at each point in time at which the frequency of the LO is changed, since the timezero phase of the LO signal at each frequency change relative to the previous timezero phase is known, and hence, the phase of the new LO signal relative to the previous timezero phase can be computed as a function of time as measured by the LO clock.

As noted above, a goal of the present invention is to characterize the phase shifts as a function of frequency in the LO signal path. The timestamps allow DSP 65 to determine the phase of the LO signal that leaves the signal generator 20. For example, the phase of the signal leaving D/A 33 is shown in FIG. 4. However, there are other components between that output point and the mixer. In the synthesizer shown in FIG. 4, filter 34 can alter the phase of the signal, as well as the signal amplitude. These alterations can vary with the frequency of the LO signal. Hence, for DSP 65 to properly compute the phases and amplitudes of the tones in the IF signal, the changes introduced by other components in the LO signal path must be known. These components include transmission lines as well as conventional filters and distortions introduced by the LO input of the mixer. These components and any filter in the LO path will be referred to collectively as the LO filter 66 in the following discussion. The LO path can be viewed as everything between points 68a and 68b that alters the phase between an ideal LO frequency synthesizer and an ideal mixer.

Figure 6:
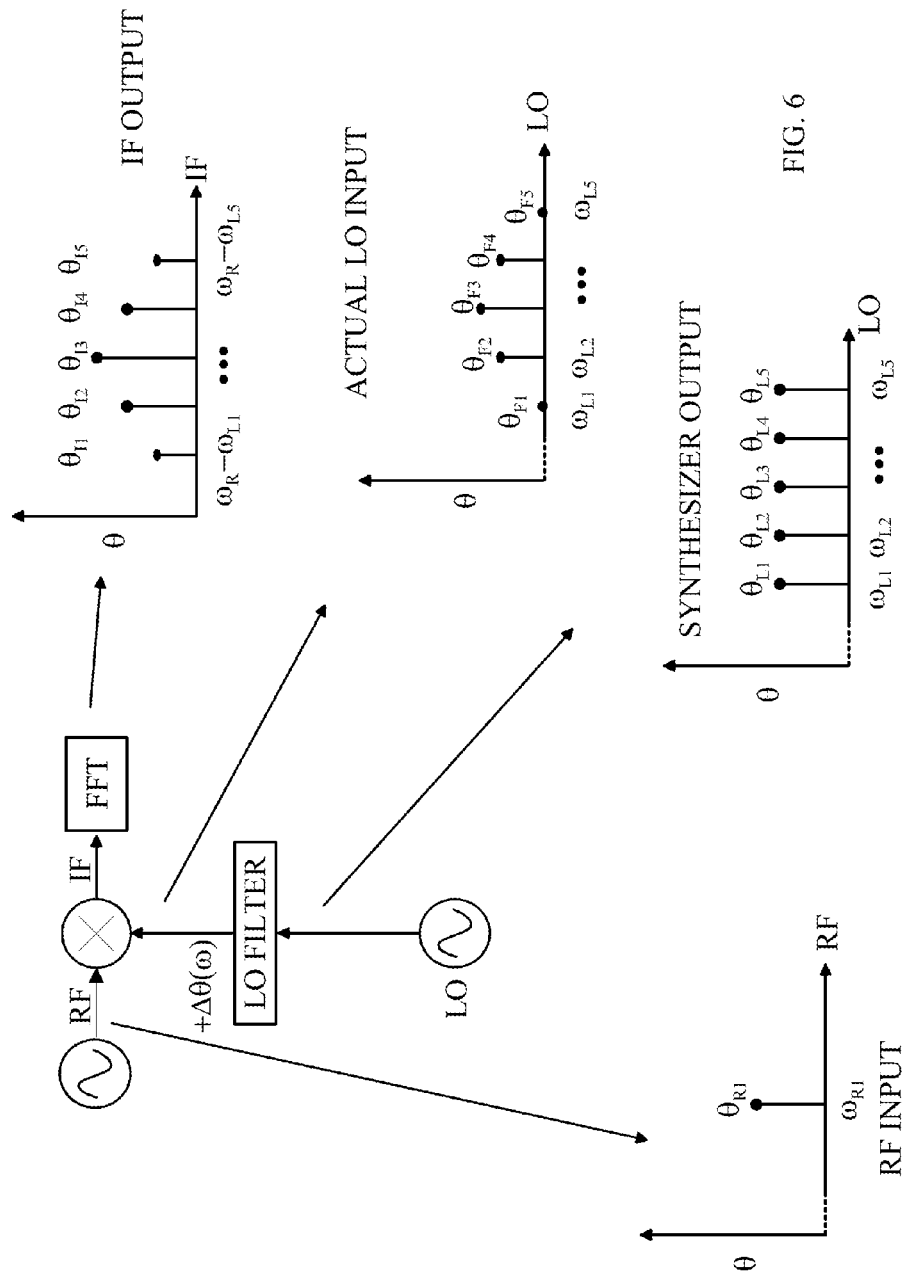
FIG. 6 illustrates the timezero phases at various locations in heterodyne receiver 60.

The manner in which heterodyne receiver 60 can be utilized to characterize the LO path will now be discussed in more detail. As noted above, if the LO path does not introduce frequency dependent distortions into the phase of the LO signal, then the phase of the signal at the mixer should be a line having an offset and a slope that is proportional to the LO frequency. For the purpose of the present discussion, characterizing the LO path consists of determining the extent to which the phase changes introduced by the LO path deviate from this line as a function of the frequency of the LO signal traversing that path. The notation can be more easily followed with reference to FIG. 6, which illustrates the timezero phases at various locations in heterodyne receiver 60. The method described below computes values of a function $\Delta\theta(\omega)$ that represents the phase added to the output of the LO synthesizer by the LO filter as a function of the LO synthesizer frequency. For an ideal LO path, $\Delta\theta(\omega)$ is a constant independent of frequency, i.e., a time delay.

To simplify the following discussion, it will be assumed that IF filter 67 and the other components in the IF signal path do not introduce any frequency dependent phase shifts. The manner in which IF signal path phase distortions are determined will then be discussed in more detail. The method for characterizing the LO signal path starts by introducing a fixed RF signal with a fixed frequency and fixed timezero phase into mixer 61, i.e., $RF(t)=A_R \cos(\omega_R t+\theta_R)$. In general, $\theta_R$ is not known. The output of mixer 61 is then measured for a number of different LO frequencies without changing $\theta_R$. The minimum number of different LO frequencies is 3; the maximum number will depend on the maximum useable bandwidth of the IF signal path. Denote the number of LO frequencies by $N_{LO}$.

Denote the $i^{th}$ LO signal by $LO_i(t)=L_i \cos(\omega_{Li} t+\theta_{Li})$, where $\theta_{Li}$ is known, and i runs from 1 to $N_{LO}$. LO filter 66, which represents all of the components between sine wave generator 21 and mixer 61 that could introduce phase distortions, converts this signal to $LO'_i(t)=L_i' \cos(\omega_{Li} t+\theta_{Fi})$. Mixer 61 generates a mixed signal $L_i' A_R \cos((\omega_R-\omega_{Li})t+\theta_R-\theta_{Fi})$. The FFT generated by DSP 65 has a tone at $(\omega_R-\omega_{Li})$ and a phase of $(\omega_R-\omega_{Li})T1+\theta_R-\theta_{Fi}$, where T1 is the timestamp generated from timestamp register 63.

To detect a deviation from linearity, two measurements are needed to compute the offset, O, and the slope, S, of the phase change as a function of frequency. The remaining measurements can then be used to measure the difference between the observed phase difference, $\theta_{Fi}-\theta_{Li}$, and the line defined by the measured slope and offset. While the offset and slope can be determined using two measurements, the three or more measurements could be fitted to a line using least squares fitting to determine the offset and slope, and the deviations from this line measured.

There are a limited number of frequencies for which $\omega_R-\omega_{Li}$ is within the bandwidth of the allowable IFs of the receiver. To provide $\Delta\theta$ values for mixer LO frequencies that generate IF frequencies outside of this band, a new input tone frequency must be utilized. Hence, the process is repeated for the new input tone frequency to reach a mixer frequency outside of the range of the current input tone. The new set of $\Delta\theta$ values can then be combined with the previous set to provide a characterization that extends over the larger mixer frequency range provided the two sets of measurements have one IF in common.

As noted above, the above-described method assumes that the IF signal path, including IF filter 67, does not introduce any significant phase distortions. In addition, the mixer may be less than ideal in that the mixer could also introduce phase distortions into the IF signal path. The phase distortions provided by the above-described calibration procedure are actually the sum of the distortions introduced by both LO and IF signal paths. These distortions include any distortions in the LO portion of the mixer that result from the mixer being less than ideal.

If the IF phase distortions are significant, a second calibration must be performed to measure the phase distortions introduced by the IF signal path. In any given mixing operation, the phase distortions of the LO path as a function of the LO frequency are combined with the phase distortions in the IF path as a function of the IF frequency. Hence, there are an almost infinite combination of LO path and IF path phase distortions. Accordingly, it is impractical to tabulate all combinations to provide the net phase distortion for all possible combinations. However, by measuring each source of distortion separately, the resulting two tables can provide the net phase distortion for any particular combination encountered. Hence, if the IF path phase distortions are known, these phase distortions can then be used to isolate the distortions of the LO signal path from those of the IF signal path to provide corrections for the phases as a function of frequency along each signal path separately.

The manner in which the IF path is calibrated is described in detail in co-pending U.S. patent application Ser. No. 15/009,309, filed on Jan. 29, 2016, which is hereby incorporated by reference. For the purposes of this discussion, the method for calibrating the IF path uses an RF signal that includes a plurality of tones having known timezero phases. The tones are sufficiently close to one another in frequency that the IF signal resulting from down-converting this signal includes three or more tones. The timezero phases of these IF tones are then fitted to a straight line and the deviations of the measured timezero phases from that straight line are determined to provide the distortions as a function of the IF frequencies. In contrast to the calibration of the LO path, a single LO frequency is utilized. Hence, the distortion introduced by the LO path is the same for all of the tones in the IF signal and is included in the determined offset.

The combination of an LO signal source, a mixer, and an IF filter path that has been calibrated to correct for the distortions in the LO path will be referred to as a calibrated mixer assembly in the following discussion. The controller in the calibrated mixer assembly stores calibration information that can be used to determine the value of the timezero phase of the LO signal as a function of frequency. The timezero phase is the timezero phase that would be seen by an ideal mixer connected to the LO signal source. For many applications, the sum of the distortions from the two signal paths is sufficient. That is, the distortions measured, assuming that the IF path had no distortions, can be utilized.

Figure 7:
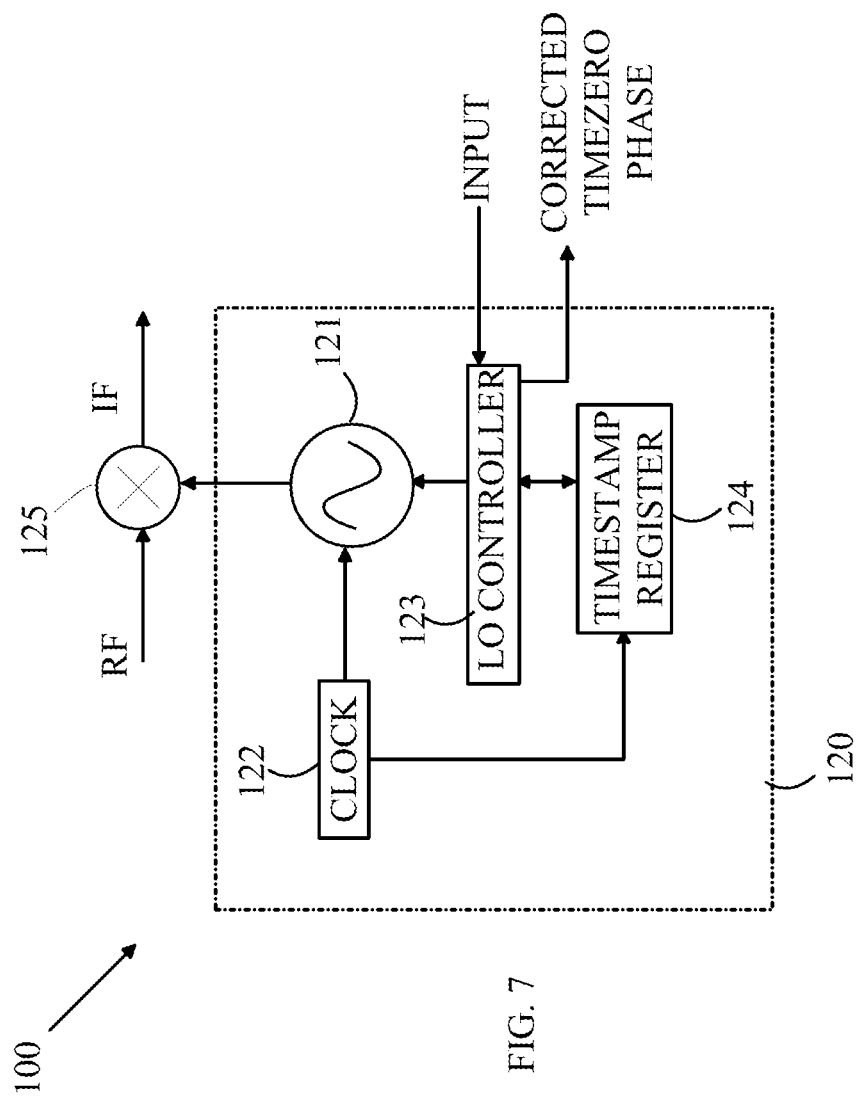
FIG. 7 illustrates one embodiment of a calibrated mixer assembly according to the present invention.

Refer now to FIG. 7, which illustrates one embodiment of a calibrated mixer assembly according to the present invention. Calibrated mixer assembly 100 includes a timestamped LO signal synthesizer 120 having a clock 122 that increments a timestamp register 124 and controls the phase and frequency of a signal synthesizer 121. An LO controller 123 receives commands specifying a frequency to be generated and outputs a corrected timezero phase for the signal at each new frequency. The correct timezero phase is the timezero phase at the LO input to the mixer that has been corrected for the phase distortions in signal synthesizer 121, any cabling connecting mixer 125 to LO signal synthesizer 120 and any internal distortions introduced by mixer 125.

Figure 9:
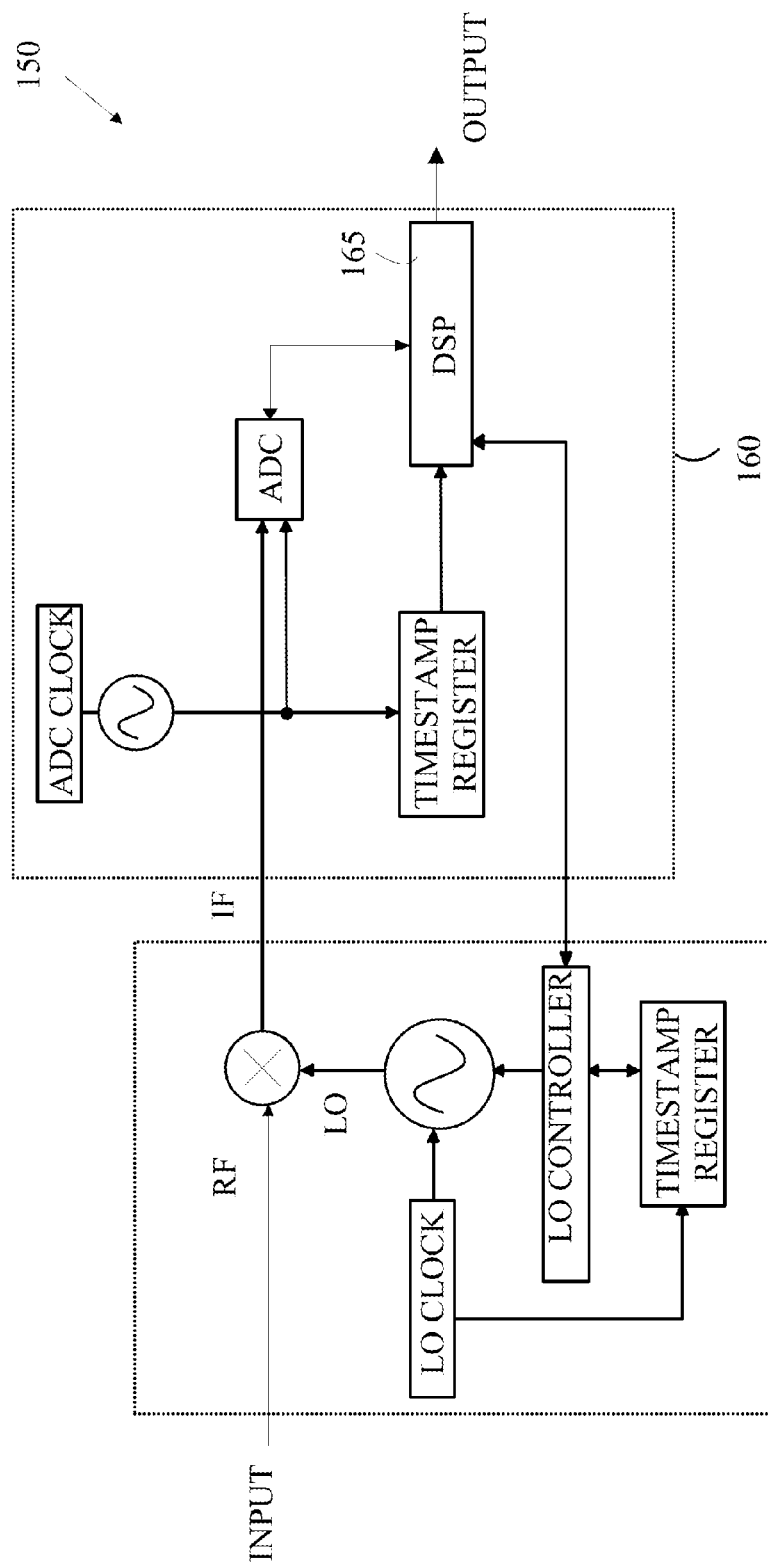
FIG. 9 illustrates one embodiment of a calibrated heterodyne receiver according to the present invention.

In the following discussion, the combination of a calibrated mixer assembly and a timestamped receiver will be referred to as a calibrated heterodyne receiver. Refer now to FIG. 9, which illustrates one embodiment of a calibrated heterodyne receiver according to the present invention. Calibrated heterodyne receiver 150 includes a calibrated mixer assembly 152 as described above. The IF output of the mixer is input to a timestamped receiver 160. DSP 165 in timestamped receiver 160 also acts as the overall system controller for calibrated heterodyne receiver 150; however, embodiments that have a separate system controller can also be constructed. To simplify the drawing, the LO and IF filters have been omitted from the drawing.

A calibrated heterodyne receiver according to the present invention can be used to implement "stitching" to piece together a spectrum for a test signal that has much greater bandwidth than that of the receiver will now be discussed in more detail. Consider a case in which the input to the mixer in the calibrated mixer assembly has a bandwidth that is much larger than the bandwidth that can be measured in the timestamped receiver from one sequence of ADC values. For example, the input signal could have a bandwidth of 100 MHz while DSP 165 can only generate a signal having a bandwidth of 20 MHz. The goal of the system is to generate a spectrum covering the entire 100 MHz range from a number of component measurements of 20 MHz spectra. In conventional analyzers, the receiver would measure six or more overlapping spectra by varying the frequency of the LO signal source. Each component spectrum would have a bandwidth of 20 MHz and a frequency range that would partially overlap that of a neighboring component frequency. While combining the component amplitude spectra is straightforward, stitching together the phases to provide a phase as a function of frequency that could have been obtained from a single 100 MHz receiver presents significant challenges, because each component spectrum has a different $t_0$ value and corresponds to a different LO frequency which introduces another phase offset.

In the prior art, the component spectra are chosen such that the spectra overlap one another in a manner in which a known frequency component is present in both spectra. The overlapped data is then used to calculate the relative phase offset of the two component spectra and the relative starting times for the component spectra. One problem with this technique is that measurement noise can cause errors in the alignment. To reduce the errors, the overlap areas must be very large, which increases the number of component spectra that must be utilized to span the desired frequency range.

Refer now to FIGS. 8A-8F, which illustrate the manner in which a calibrated heterodyne receiver 60 can be used to perform a spectrum stitching measurement. To simplify the following discussion, the present example requires only two component spectra to provide a stitched spectrum; however, it will be apparent from this example that the procedure can be expanded to provide for stitching many more component spectra. Once again, the amplitude spectra have been omitted from the drawing; however, it is to be understood that there is a corresponding amplitude spectrum for each of the phase spectra discussed here.

Figure 8C:
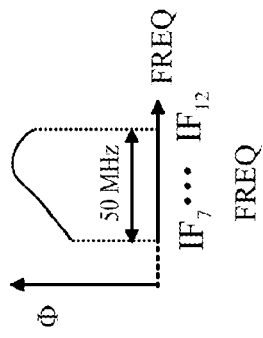
FIGS. 8A-8F illustrate the manner in which a calibrated heterodyne receiver can be used to perform a spectrum stitching measurement.
Figure 8B:
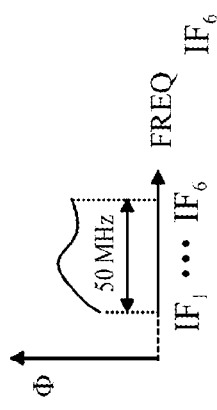
Figure 8A:
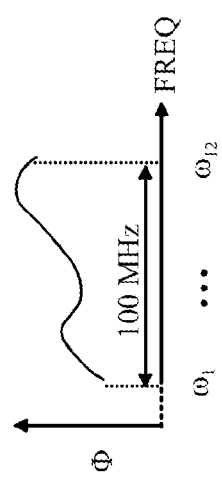

For the purposes of this example, an input signal having a 100 MHz frequency band of interest is assumed as shown in FIG. 8A. It will be assumed that there are 12 tones of interest, $\omega_1$ through $\omega_{12}$, in this input signal. Denote the input signal to mixer 61 by $$S(t) = \sum_{1}^{12} A_i \cos(\omega_i t + {}^S\theta_i)$$

The ${}^S\theta_i$ values are shown in FIG. 8A. For the purposes of this example, the amplitudes $A_i$ are not shown, since only the ${}^S\theta_i$ values are the subject of this example. It is assumed that the receiver has a limited bandwidth, and hence, can only down-convert $S(t)$ to six intermediate frequencies for any given LO frequency generated by signal generator 20. Hence, $S(t)$ will be characterized by first down-converting $S(t)$ to six IFs, $IF_1$ to $IF_6$, using a first LO frequency to measure the first six tones in $S(t)$ and then down-converting $S(t)$ to six additional IFs, $IF_7$ to $IF_{12}$, using a second LO frequency to measure the remaining six tones in $S(t)$. The second set of IFs may be different than the first set of IFs.

Denote the first LO signal provided to the mixer after correction for the LO and IF paths by $$L_1(t)=L\cos(\omega_{L1}t+\theta_{L1})$$

Here, $\theta_{L1}$ is the phase after correction for the LO and IF paths. Since signal generator 20 is a calibrated mixer assembly, $\theta_{L1}$ is known. The output of the mixer is a signal $$^1IF(t) = \sum_{1}^{6} B_i \cos[(\omega_i - \omega_{L1})t + ({}^S\theta_i - \theta_{L1})]$$

This signal is digitized and converted by the FFT to a set of six amplitudes and phases. Denote the phases by ${}^1\phi_i$, for i=1 to 6. DSP 65 records the time, $t_1$, at which the sequence converting by the ADC began. The phases correspond to some time t' that is related to $t_1$. The measured phases are related to the input signal and LO phases by $$^1\phi_i=(\omega_i-\omega_{L1})t'+({}^S\theta_i-\theta_{L1})$$

Figure 8F:
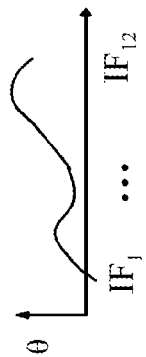

The FFT also provides the frequency of the IF tones, i.e., $$^1IF_i=\omega_i-\omega_{L1}$$

$$^S\theta_i=\theta_{L1}-{}^1IF_i t'+{}^1\phi_i$$

for i=1 to 6. These values of ${}^S\theta_i$ are shown in FIG. 8D. It should be noted that ${}^S\theta_i$ still depends on one unknown parameter, t'.

Next, the LO signal is then changed to a new frequency, $\omega_{L2}$ and phase $\theta_{L2}$ to capture the next set of tones in the input signal. The second LO signal is denoted by $$L_2(t)=L'\cos(\omega_{L2}t+\theta_{L2})$$

Here, $\theta_{L2}$ is also known. The new LO frequency is chosen such that the next group of signal frequencies will be down-converted into the allowed IF signal band. The new IF signal can be written as $$^2IF(t) = \sum_{1}^{6} B_i \cos[(\omega_{i+6} - \omega_{L2})t + ({}^S\theta_{i+6} - \theta_{L2})]$$

This IF signal is digitized and converted by DSP 65, which records the time, $t_2$, at which the sequence converting by the ADC began. The measured phases are shown in FIG. 8C. The phases of the IF tones, correspond to some time t" that is related to $t_2$. The measured phases are related to the input signal and LO phases by $$^2\phi_i=(\omega_{i+6}-\omega_{L2})t''+({}^S\theta_{i+6}-\theta_{L2})$$

The FFT also provides the frequency of the IF tones, i.e., $$^2IF_i=\omega_{i+6}-\omega_{L2}$$

$$^S\theta_{i+6}=\theta_{L2}-{}^2IF_i t''+{}^2\phi_i$$

for i=1 to 6. Since the timestamp register associated with the ADC has continued to count between $t_1$ and $t_2$, $t''=t'+(t2-t1)$. Hence, $$^S\theta_{i+6}=\theta_{L2}-{}^2IF_i(t'+\Delta t)+{}^2\phi_i$$

where $\Delta t=t_2-t_1$.

Figure 8E:
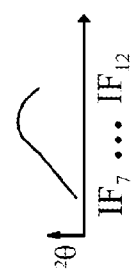
Figure 8D:
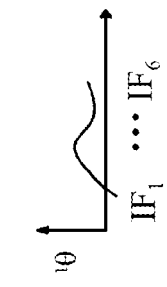

This second set of phases is shown in FIG. 8E. The IFs correspond to known frequencies in the input signal, and hence, the two sets of phase measurements can be combined to provide the phase as a function of input frequency as shown in FIG. 8F.

It should be noted that all of the phases have an added unknown phase that is proportional to t'. The time t' is the time of the ADC sequence that is transformed by the FFT. The basis functions of the FFT can be chosen such that the timezero phase of each of the basis functions is zero. In this case, t'=0. The resulting phases are then measured relative to the time at which the FFT basis functions have 0 phase.

The above-described embodiments utilize a timezero phase that is the phase of a tone at a point in time that is defined to be the point at which a clock is 0. However, the teachings of the present invention can be applied in any system in which there is a clock that measures absolute time and in which the phase of the output of the signal synthesizer changes continuously over time during any frequency change in that synthesizer without explicitly computing the phase of the signal at t=0 on that clock. Knowing the phase of the signal at any specific time on the clock and the history of changes in frequency and/or phase including the clock at which each change was made and the nature of the change, is sufficient to allow the phase of the signal after the change to be computed in terms of the phase of the signal before the change. If the phase of the signal before the change was known in absolute terms, then the phase of the signal after the change is also known in absolute terms. If the phase of the signal before the change was not known in absolute terms, then the relative phase of the signal in terms of the phase of the signal before the change can be determined. The later case is often sufficient for many measurement problems in which phase changes are the variables of interest.

Accordingly, the term "reference phase", denoted by $\Phi_r$, is defined to be phase of a tone at a known point in time, $t_r$, referred to as the reference time. The timezero phase is $\Phi_r - \omega t_r$. The clock values captured by the timestamps provide the reference times at which the frequency or phase was changed.

In the above-described embodiments, the clock whose pulses are counted to provide the timestamps for the source is the same clock that is used by the signal synthesizer to control the output of the signal synthesizer. In general, the synthesizer will change frequency or reset the phase of the output at a time determined by some clock. For example, the frequency change will occur on an edge of that clock. The counter that counts the clock pulse to provide the timestamps is likewise synchronized with that clock. Hence, the counter value is an accurate measure of the time at which the frequency change was instituted. At most, the time of the frequency change is offset from the time on the clock by a constant amount that can be determined by a calibration procedure.

In principle, the clock that is used to define the time values that are recorded in the timestamps could be an entirely separate clock from the clock used by the synthesizer. However, in this case, the time represented by counting pulses from this clock could have an uncertainty of half a clock cycle relative to the clock used by the synthesizer. Hence, the timestamp could have an uncertainty of one half a cycle of the timestamp clock. As a result, there would be an error in determining the phase of the signal after the frequency change. At high frequencies, this error could be unacceptable. Hence, using the same clock for synchronizing the synthesizer and the timestamps is preferred.

In the above-described examples, any phase distortions introduced by the RF signal path while calibrating the LO signal path of a mixer did not alter the final results, since the contributions from RF path phase distortions were removed by measuring the difference between the observed phases and the line fitted to the various measurements made with the same RF signal. In the example in which the IF path distortions are measured, it was assumed that the RF path phase distortions are negligible. However, this is not always the case, and hence, measurement of the RF path phase distortions is needed in some cases.

In principle, the RF distortions could be measured by using a multi-tone calibrated RF signal in which the timezero phases of the tones are known and in which the tones are spaced at appropriate intervals to provide a down-converted signal that fits into the bandpass of the IF receiver. However, providing such a calibrated RF signal presents challenges whose solutions are economically unattractive. However, a calibrated mixer assembly in a VNA having a timestamped receiver can measure the distortions using a series of single tone RF signals having arbitrary timezero phases to measure the phase distortions as a function of frequency one frequency at a time.

Figure 10:
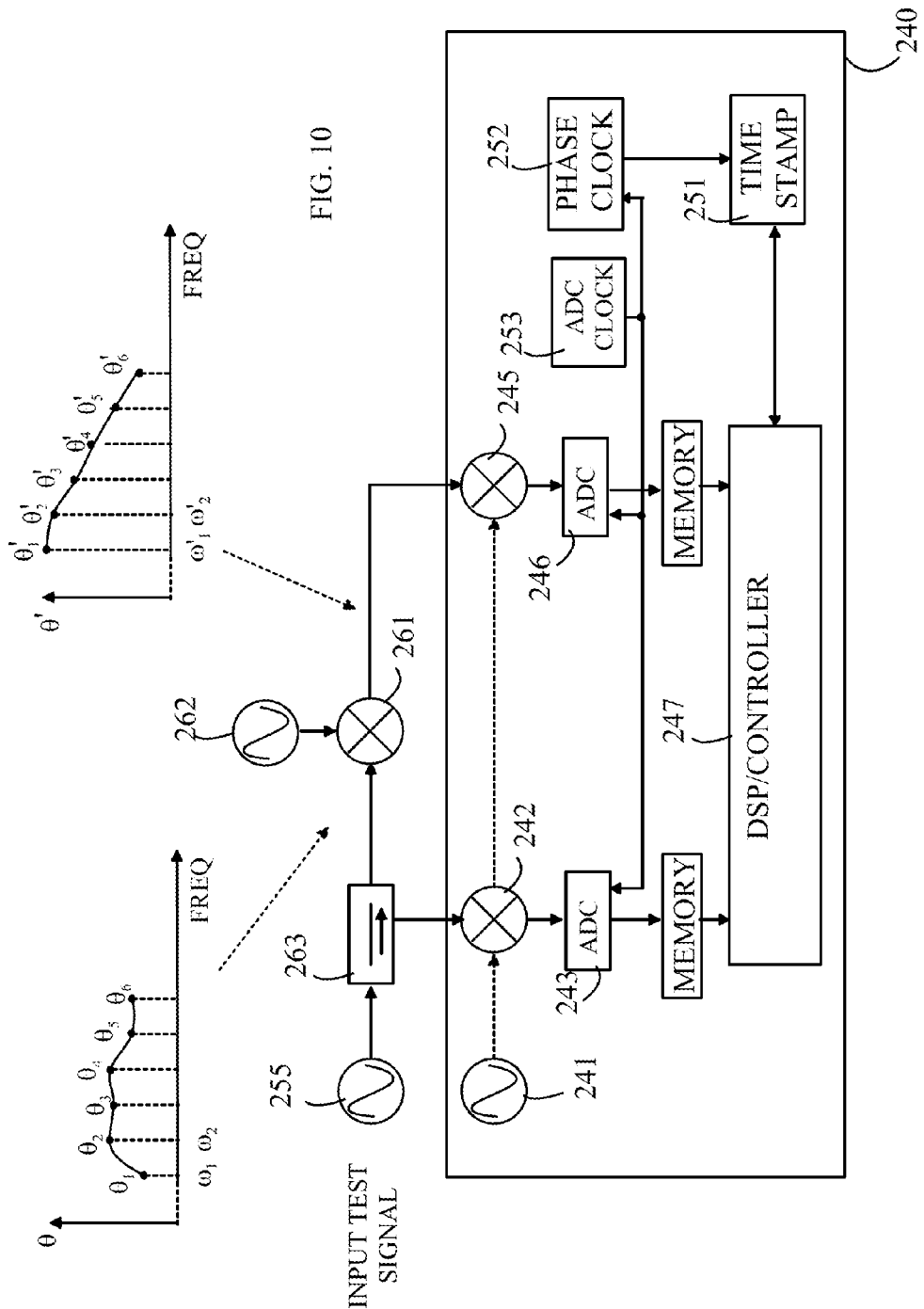
FIG. 10 illustrates another exemplary use of a calibrated mixer assembly according to the present invention to measure the phase distortions introduced by the RF signal path in a mixer.

Refer now to FIG. 10, which illustrates another exemplary use of a calibrated mixer assembly according to the present invention to measure the phase distortions introduced by the RF signal path in a mixer. VNA 240 is configured to provide data for characterizing a mixer 261. The goal of the measurements is to compute the changes in phase of an input signal that are introduced by mixer 261 as a function of frequency. The RF signal path can optionally include a filter which can introduce phase distortions into the IF signal generated by down-converting the RF signal using mixer 261. In addition, the deviation of mixer 261 from an ideal "mixer" can also introduce such phase distortions. Finally, there are transmission cables between the RF source and mixer 261 that can introduce phase distortions.

In the example shown in FIG. 10, a single tone RF signal is generated by signal source 255 and input to mixer 261 after being split by coupler 263. The output of coupler 263 is measured by one channel of VNA 240. The RF signal is then down-converted in mixer 261 to an IF signal that is analyzed by a second channel of VNA 240. Mixers 242 and 245 in VNA 240 are calibrated mixer assemblies that share the same LO signal generator 241. The timezero phase of the input RF tone is determined by setting LO signal generator to a first LO frequency and using ADC 243 to digitize the IF signal. DSP/controller 247 then determines the timezero phase of the RF tone using phase clock 252 and the timestamp 251 generated for the beginning of the sequence of IF signal values.

After the timezero phase of the input RF tone, $\theta_1$, is determined, the timezero phase, $\theta'_1$, of the output of mixer 261 is determined using mixer 245 and ADC 246. In this second measurement, the LO signal will be at a different frequency to compensate for the fact that the signal from mixer 261 has already been partially down-converted.

Next, the frequency of the single tone RF signal from signal source 255 is changed and the process repeated to obtain timezero phases for the input RF signal to mixer 261 and the output signal from mixer 261. The frequency of the LO signal to mixer 261 remains the same as that in the measurement of the first single tone RF signal. This process is repeated for a minimum of three different RF signal frequencies.

The difference in the timezero phase from the input to the output of mixer 261 includes an offset determined by the phase of the LO signal from LO signal generator 262. However, this offset is the same for each of the RF tones. In addition, timezero phases of the input RF tones also contain some fixed offset. The remaining offsets that result from making the various measurements at different times are eliminated by the timestamp procedure in the timestamped receiver of the VNA. In addition, the distortions introduced by mixers 242 and 245 are eliminated by the calibration data. Accordingly, if mixer 261 does not introduce any phase changes that are a function of the RF frequency, the difference in the timezero phases between the input signal and the output from mixer 261, $\theta_i-\theta'_i$, as a function of RF frequency should be described by a line having an offset and slope. Hence, the measurements can again be fit to a line. The deviations from this line represent the phase distortions introduced by mixer 261.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
   a mixer assembly comprising a mixer and an LO signal generator, said mixer being characterized by an RF input, an LO input, and an IF output, said LO input being characterized by an LO signal path coupling an LO signal input terminal to said LO input, said LO signal path introducing phase distortions into an LO signal connected to said terminal, said LO signal generator generating an LO signal having a known timezero phase and coupling said LO signal to said LO signal input terminal;
   a receiver having an IF input connected to said IF, said receiver being adapted to receive an IF signal on said IF input; and
   a controller that corrects said known timezero phase for said phase distortions and determines a phase of a tone in a signal coupled to said RF input from said corrected timezero phase and a tone in said IF signal.

2. The apparatus of claim 1 wherein said receiver is a timestamped receiver.

3. The apparatus of claim 1 wherein said mixer assembly is a calibrated mixer assembly.

4. The apparatus of claim 1 wherein said mixer assembly is adapted to receive a first test signal having one or more tones, wherein said receiver records a first sequence of digital values starting at a first time and a timestamp value at said first time.

5. The apparatus of claim 4 wherein said mixer assembly generates a first LO signal and couples that LO signal to said LO input, said controller generating a first phase spectrum from said sequence of first sequence of said digital values starting at said first time and said timestamp value at said first time, said first phase spectrum comprising a phase corresponding to each of said tones in said first test signal, said first phase spectrum being independent of said first time.

6. The apparatus of claim 5 wherein said mixer assembly generates a second LO signal and couples that LO signal to said LO input, said controller generating a second phase spectrum from a second sequence of digital values starting at a second time and a second timestamp value at said second time, said second LO signal having a different frequency from said first LO signal and said controller combining said first and second phase spectra.

\* \* \* \* \*